(12) United States Patent
Nguyen

(10) Patent No.: US 6,507,207 B2
(45) Date of Patent: Jan. 14, 2003

(54) CONTACT PROBE PIN FOR WAFER PROBING APPARATUS

(76) Inventor: Vinh T. Nguyen, 245 Blossom Hill Rd. #9, San Jose, CA (US) 95123

( * ) Notice: Subject to any disclaimer, the term of this patent is extended or adjusted under 35 U.S.C. 154(b) by 0 days.

(21) Appl. No.: 09/789,600

(22) Filed: Feb. 20, 2001

(65) Prior Publication Data

US 2002/0113612 A1 Aug. 22, 2002

(51) Int. Cl.⁷ .............................................. G01R 31/02
(52) U.S. Cl. ..................................... 324/761; 324/754
(58) Field of Search ................................ 324/754, 765, 324/72.5, 758, 761, 762; 439/482, 169, 174, 912

(56) References Cited

U.S. PATENT DOCUMENTS

| | | | | |
|---|---|---|---|---|
| 2,771,588 A | * | 11/1956 | Schinske et al. | 174/77 R |
| 4,931,726 A | * | 6/1990 | Kasukabe et al. | 324/754 |
| 5,378,971 A | * | 1/1995 | Yamashita | 324/72.5 |
| 5,690,998 A | | 11/1997 | Nagasawa et al. | 427/255.6 |
| 5,893,713 A | * | 4/1999 | Garman et al. | 433/224 |
| 5,952,843 A | | 9/1999 | Vinh | 324/761 |
| 6,034,532 A | * | 3/2000 | Tarzwell | 324/754 |

* cited by examiner

Primary Examiner—Michael Sherry
Assistant Examiner—Minh N. Tang
(74) Attorney, Agent, or Firm—Oppenheimer Wolff & Donnelly LLP; Claude A. S. Hamrick

(57) ABSTRACT

An improved contact probe pin for wafer probing apparatus including an elongated metal conductor having a connector (or proximal) end, a center or medial section coated with an elastic material, and a contact pad engaging tip end. At least a portion of the center section of the probe pin is coated with a poorly conductive, but highly elastic material so as to enhance its flex characteristics. The coating may uniformly cover a portion of the center section of the probe pin or it may take on a predetermined pattern or shape. The coating may also unevenly cover a portion of the center section of the probe pin. The coating is selected such that it augments or enhances the resiliency of the pin and causes it to have a predetermined stress-strain profile with vertical (or Z-axis) displacement, and thus enables it to have predetermined probe pin tip contact force characteristics.

20 Claims, 4 Drawing Sheets

Fig_1

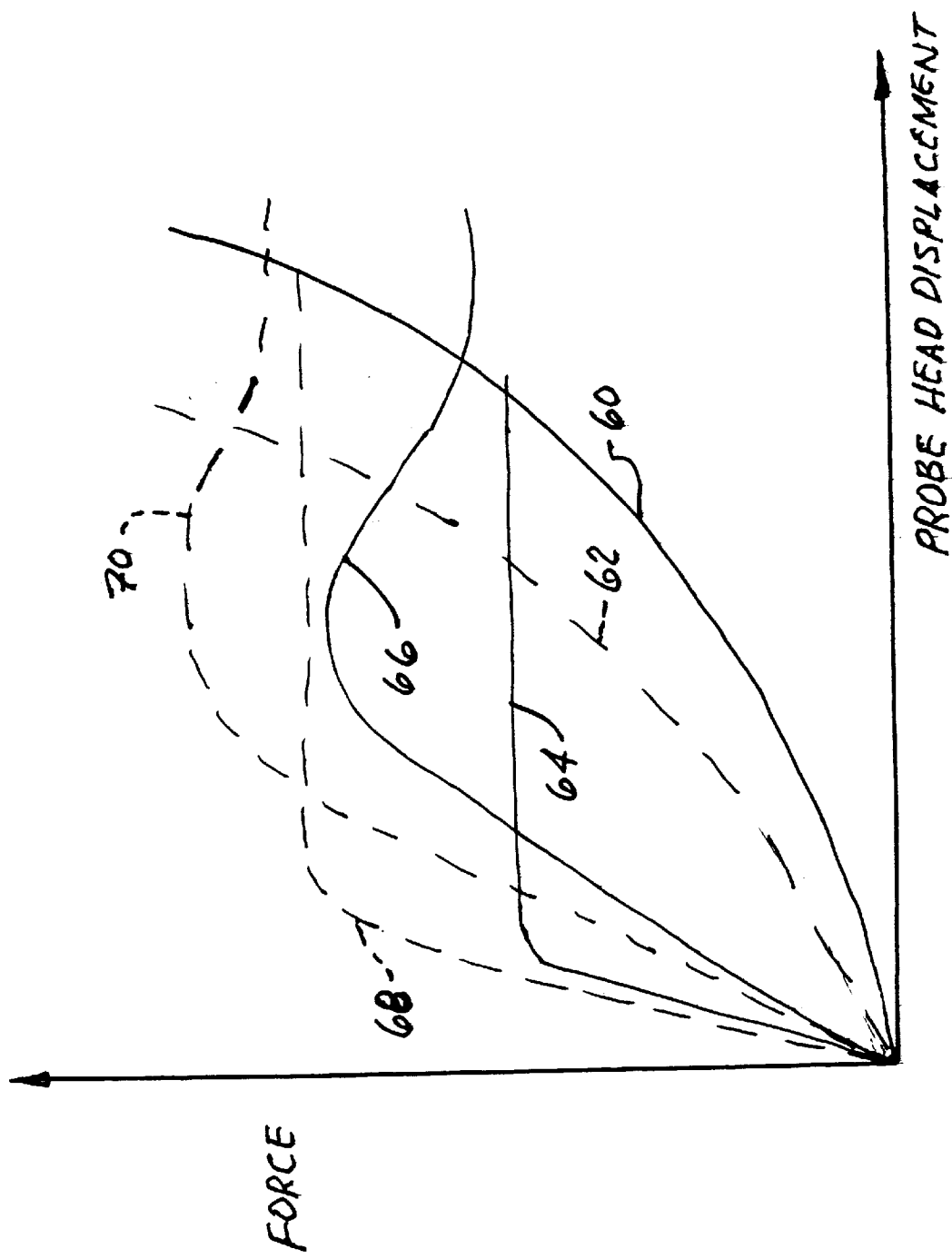

CONTACT PROBE PIN FOR WAFER PROBING APPARATUS

BACKGROUND OF THE INVENTION

1. Field of the Invention

The present invention relates generally to semiconductor wafer probing apparatus, and more particularly, to an improved contact probe pin device including an elongated conductor component having a coating of a substantially less conductive metal with high elastic properties.

2. Description of the Prior Art

Discrete semiconductor devices are typically formed on a semiconductor substrate employing precise photolithographic techniques. A plurality of such devices are usually formed on a single wafer and the wafer is subsequently sliced into separate individual die upon completing the fabrication process. However, prior to slicing, the partially finished devices are often tested using a wafer probe apparatus to electrically engage bond pads on the dice to evaluate the electrical characteristics thereof.

Conventional probe technologies have historically included two basic types of probe apparatus, i.e., those using cantilever type bond pad engaging probe pins and those using vertically aligned die pad engaging probe pins. Cantilever probes are comprised of a plurality of substantially horizontally disposed cantilevered probe pins extending radially inward from a probe card and then usually downwardly to form die pad engaging tips. Contact pressure is determined by the amount shear strain or bending displacement of the probe tip and the pin's stress-strain profile. Since the stress-strain profile and hence the contact force, decreases with increasing cantilever length, poor or incomplete penetration of a device's inner bond pad's passivation layer may result when longer cantilever probe pins are used. Accordingly, cantilever type probes are typically design restricted to devices having peripheral device bond pads.

Vertical probe pin cards include generally vertically aligned, straight or near straight pins arranged in an ordered, addressable array. The array coincides with the bond pad positions of the device under test. Vertical probe pin densities are normally higher than cantilever-type probes, and multiple devices may be tested by a single probe card (i.e., grid array probing).

The contact force of vertical-type probe pins is determined by either the compressive strain of the pin, or by resilient material against which the end of the probe pin may act. One problem with this type of probe is that, depending on the pin configuration, the contact force of the probe pin tip may increase with increasing vertical displacement of the probe. Another problem is that in order to ensure uniform probe tip contact force across all bond pads, the probe tips must be carefully aligned in the Z-plane; i.e., have a high probe tip planarity.

Still another problem with vertical probe tip assemblies is the criticality of precise vertical control of the probe assembly. The vertical position of the entire probe assembly must be precisely controlled to ensure that the probe pin contact pressure is uniform and within a predetermined contact force across all of the bond pads on the semiconductor device. Whereas the extent of the probe assembly's vertical travel must be sufficient to ensure a contact force sufficiently high to pierce the passivation layer of all the bond pads, it must not extend so far as to exert excessive contact pressure which might damage the probe, the bond pad, or nearby wire connections. This vertical displacement criticality arises in part as a result of the compressive strain spring constant of vertical-type probe pins. Since contact force is proportional to probe tip vertical displacement, precise control of the vertical travel of the probe assembly is necessary to ensure uniform contact force and penetration of the passivation layer at each bond pad.

The ability of vertical-pin probe tips to penetrate the passivation layer of the bond pad is aggravated in some probe devices in that the vertical displacement of the probe tip does not create an X or Y force component to allow the probe to "scrub" or "shear" through the passivation layer. Consequently, vertical pin probe tips crush the passivation in order to establish electrical contact between the probe tip and the bond pad. As a result, relatively higher contact forces are needed to pierce the passivation layer. This in turn results in lower device yields due to an increased likelihood of damage to the bond pads and connecting wires, and increased particulate contamination.

A further problem with vertical pin probes arises as the bond pad density increases with increasing integration density of a semiconductor device. The resulting increase in the number of probe pins needed to test the semiconductor device exerts a correspondingly increased cumulative force in the semiconductor device and the probe card. For example, in the case of a probe card having 500 probe pins, a force of 5 grams exerted by each probe pin results in a cumulative force of about 2.5 kilograms exerted on the device under test and on the entire probe card. As the number of probe pins increases even further, the vertical load on the probe card also increases resulting in possible deformation of the probe assembly, which in turn degrades probe tip planarity.

Still another problem with vertical pin probes is that because the wire used to make the probe pins is very small in diameter, there is a likelihood that as axial load is applied to the pin, it may experience deformation exceeding its intended delection and engage other pins. It is possible that the deflection may exceed the pin's elastic limit and cause it to become permanently deformed. On the other hand, pins made of such wire may experience situations in which the wire stiffness is not sufficient to cause penetration of the passivation layer or otherwise not make good ohmic contact with the bond pad. Accordingly, material selection for the conductive wire plays a substantial part in the design of the probe pin; that is, not only must the material have high conductivity, it must have good resilience properties. This usually affects the cost of the material selected.

Various attempts to address the aforementioned problems have been tried, including the designs disclosed in my prior U.S. Pat. No. 5,952,843 entitled "Variable Contact Pressure Probe", the disclosure of which is expressly incorporated herein by reference. However, there still exists, a need for an improved pin design for use in wafer probe assemblies having high pin density. There's also a need for a probe design wherein the cumulative contact force of multiple probes within a wafer probe assembly may be controlled even as probe pin count/density increases. Such pin design usually must be small in transverse dimension in order to enable high pin density, be stiff enough to apply appropriate contact force, and be resilient enough to return to its rest configuration when withdrawn from contact with the semiconductor devices. There is also a need for a pin design allowing wire of high conductivity but limited stiffness to be used.

SUMMARY OF THE INVENTION

It is therefore an important objective of the present invention to provide a pin design having means for enhancing the resiliency characteristic of the conduction wire used to form a probe pin.

Another objective of the present invention is to provide a probe pin design in which the elastic or resilient properties of the wire material used in the pin plays a less critical role than was heretofore the case.

Still another objective is to provide a probe pin design in which the flex characteristics can be controlled substantially independent of the flex characteristics of the conductor material.

Briefly, a probe pin in accordance with the present invention includes an elongated metal conductor having a connector (or proximal) end, a center or medial section coated with an elastic material, and a contact pad engaging tip end. More specifically, at least a portion of the center section of the probe pin is coated with a poorly conductive, but highly elastic metal so as to enhance the flex characteristics of the probe pin. The coating may uniformly cover a portion of the center section of the probe pin or it may take on a predetermined pattern or shape. The coating may also, in some applications, unevenly cover a portion of the center section of the probe pin. The coating is selected such that it augments or enhances the resiliency of the pin and causes it to have a predetermined stress-strain profile with vertical (or Z-axis) displacement, and thus enables it to have predetermined probe pin tip contact force characteristics. The pin may be configured so that a pre-selected contact force is obtained within a first few microns of probe tip vertical displacement (the initial overdrive) and then remains essentially constant or varies in a predetermined fashion with further displacement of the probe tip.

Advantageously, the coating may be designed to ensure that the contact force will be substantially the same for all probe pins after all of the probe pin tips have been displaced by at least the initial overdrive distance.

In some embodiments the probe tip may be canted or bent at an angle of between zero and about 12 degrees to that of the longitudinal axis of the probe pin. The canted tip advantageously creates an X-Y shear force component from the z-direction stress on the canted probe tip as it is brought into contact with the bond pad of the device under test. The length of the scrub mark resulting from lateral movement of the probe tip across the bond pad is conveniently controlled by adjusting the tip cant angle. A smaller scrub mark minimizes contact damage to the semiconductor contact pad elements causing less damage to wire bonds and reduced particulate contamination resulting in higher device yields.

In embodiments adapted for use with bump bond pads there is no need for a canted probe tip. In these applications of the present invention, the probe pin may include a non-canted pin tip (the tip's longitudinal axis is coaxial with the longitudinal axis of the probe pin), or else the probe pin is canted only slightly. Either a straight probe tip or a probe tip having a small cant angle is sufficient to create a force component parallel to the non-planar surface of the bump sufficient to pierce the passivation layer covering the semiconductor device.

The probe pins of this invention are advantageously fabricated from a length of stiff, resilient electrically conductive filament or wire. The stress-strain characteristics of the uncoated material chosen preferably includes stress-strain behavior generally at the lower end of the stress ranges and anticipated by the probe pin during use. Also, the critical shear stress of the selected wire is above the maximum anticipated probe pin contact force so as to ensure that forces applied to the pin do not exceed its elastic limit.

Accordingly, wire diameters ranging from about 10 microns ($\mu$m) to about 200 $\mu$m, may be used depending upon the design specification for probe pin contact force and stress-strain profile of the probe pin. In a preferred embodiment, a commercially available metal wire, Paliney 7® manufactured by J.M. Ney Company and distributed by STI Incorporated (Marlborough, N.J.) exhibits the desired mechanical and electrical characteristics (e.g., high elasticity, high critical shear stress point and high electrical conductivity) and may be selected for use in forming the probe pins. Paliney 7® is a precious metal alloy comprised of gold, platinum, palladium, silver, copper and zinc. Other materials suitable for fabricating the probe pin of the present invention include metals such as gold and platinum and their alloys, stainless steels, tungsten, tungsten alloys, nickel alloys, metal plated laminates, electrically conductive plastics and electrically conductive polymer composites. Alternatively, wires made of beryllium copper, rhodium tungsten and neodymium, or equivalents thereof may also be used.

The probe pin coatings of this invention are selected to include highly elastic but poorly conductive material that can be applied by coating the probe pin either uniformly, unevenly, or according to a predetermined pattern or shape. The stress-strain characteristics of the material chosen include resilient elastic behavior in the stress ranges anticipated by the finished probe pin. Accordingly, a coating diameter of approximately 20 $\mu$m to 400 $\mu$m may be used depending on the desired coating pattern contact force, resulting stress-strain profile, and transverse diameter of the coated pin. In the preferred embodiment, a commercially available coating Nitinium (Niti), manufactured and distributed by Shape Memory Alloys Corporation (San Jose, Calif.) exhibits the desired mechanical and electrical characteristics (e.g., high elasticity and low conductivity) and may be selected for coating the probe pins of the present invention.

Other materials suitable for coating the probe pin include metals, alloys, ceramics, polymer composites and hybrid materials known to those skilled in the art to be equivalent to the properties of Nitinium. The probe pin coating of this invention may completely envelop or cover the entire center section of the pin or may cover only a portion of one or more sides thereof depending upon the pin configuration.

Furthermore, the coating may cover one or more portions along the length of the center section either uniformly or unevenly to create a specified stress-strain functional profile. In the preferred embodiment, approximately 65 percent to 95 percent of the length of the probe pin may be covered with the coating material. The coating may take any of a myriad of shapes including a continuous spiral or other uneven coating of one side or portion of one side as well as other shapes and patterns performing the desired function.

The preferred embodiment includes a combination of conductive wire and a but highly elastic, or resilient, coating of low electrical conductivity (substantially nonconductive) material selected such that the overall flex characteristics of the composite probe pin meet the design requirements of a particular application.

IN THE DRAWINGS

FIG. 5 is a stress-strain diagram illustrating the functional characteristics of three probe pin designs before and after coating in accordance with the present invention.

DETAILED DESCRIPTION OF THE PREFERRED EMBODIMENTS

Figure 1:
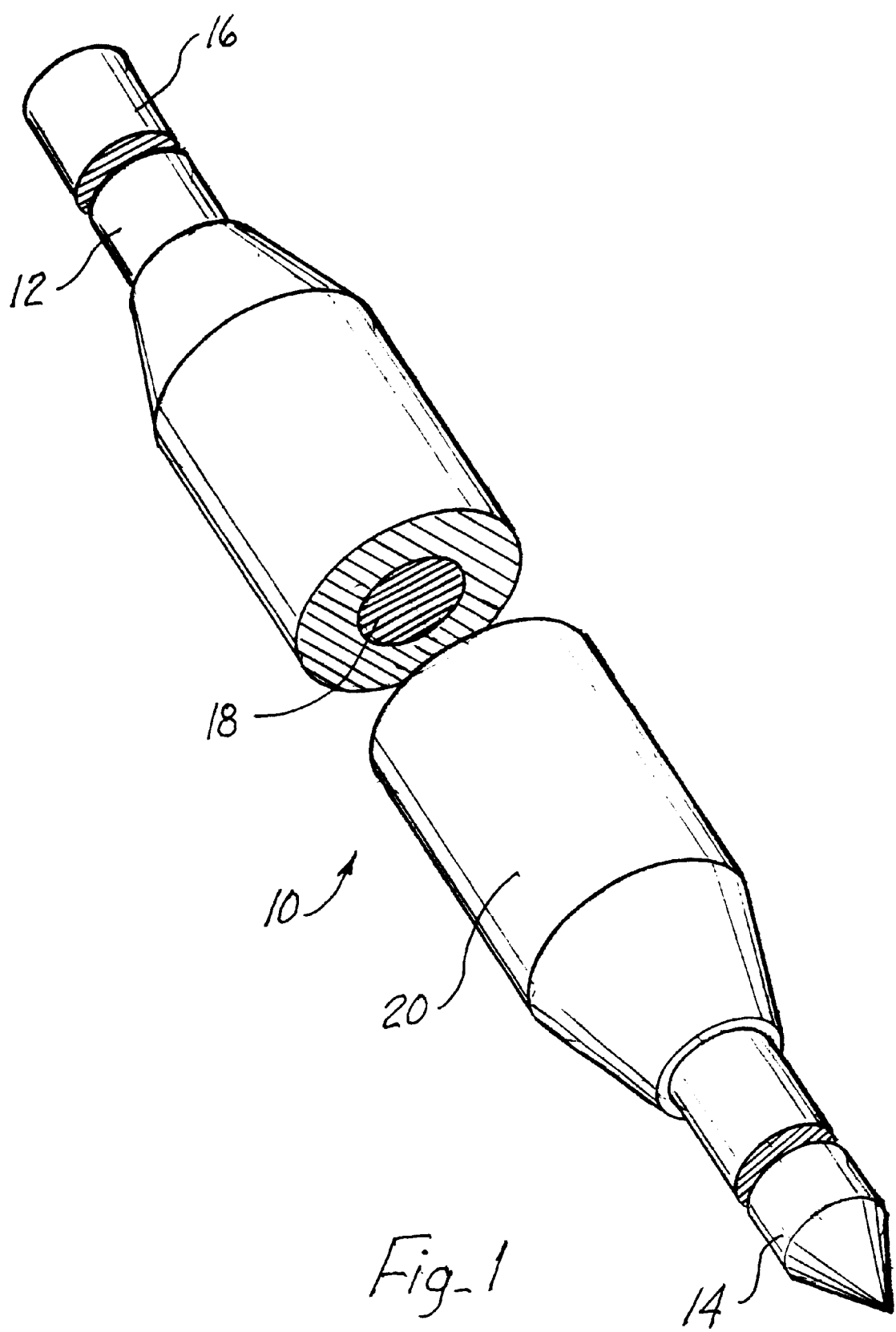
FIG. 1 is a partially broken perspective view illustrating a probe pin in accordance with the present invention.

Referring now to FIG. 1 of the drawing, an exemplary probe pin of the type used in "vertical probe" devices is shown in enlarged, broken perspective to clearly illustrate the structure thereof. As depicted, the pin 10 includes a length of conductive wire 12 having the characteristics mentioned above, and includes a tip end 14, a connector end 16, and a center or mid-section 18 extending between the two end sections and covered by a substantially non-conductive coating 20 having the elastic properties referred to above.

Figure 2:
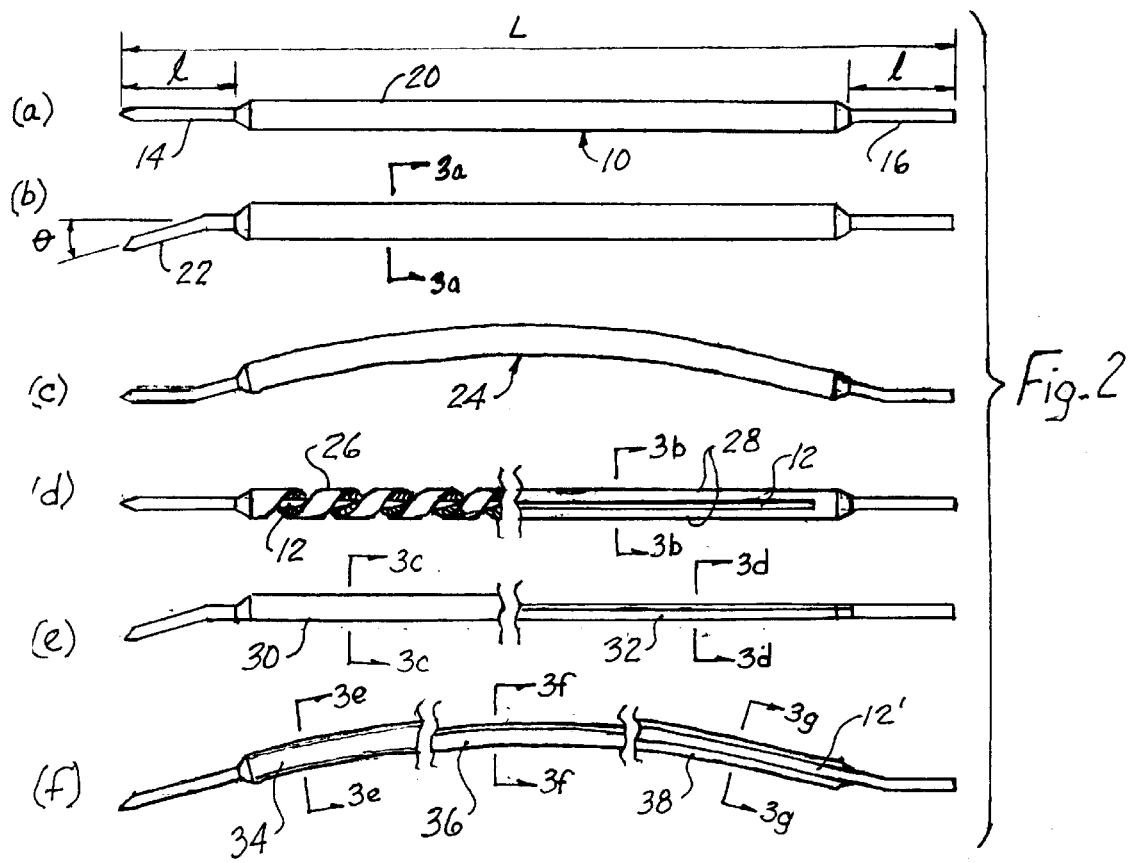
FIG. 2 is a multipart depiction of several configurations of probe pins fabricated in accordance with the present invention.

A side view of the pin 10 is illustrated in part (a) of FIG. 2, wherein the overall length of the pin is indicated by "L" and the uncoated lengths of the tip end portion 14 and connector end portion 16 are indicated by "I". In accordance with a preferred embodiment of the invention, the pin length "L" is typically within the range of 40 mils to "1", and the lengths "I" of the tip and connector portions are typically within the range of 5 mils to 100 mils in length. As is noted in parts (b) and (c) of FIG. 2, the pin may also take various non-straight configurations. For example, in part (b), the tip end portion 14 is shown deformed to one side by an angle θ. In part (c) of FIG. 2, a pin having a bowed mid section is illustrated at 24. In parts (a)–(c) of FIG. 2, it is presumed that the coatings 20 are uniform along the length of the mid-section and have a transverse cross section of the type illustrated in part (a) of FIG. 3. As will be noted in that figure, the outside diameter of wire 12 is indicated by the dimensional arrow D1, and the outside diameter of the coating 20 is indicated by the arrow D2. In a typical embodiment, the diameter D2 is approximately equal to twice the dimension D1. However, a typical range for the ratio D2/D1 is between 1.2 and 3.

Although the pins shown in parts (a)–(c) of FIG. 2 are illustrated as having uniform coatings along their mid or medial portions, it will be appreciated that the coating need not be uniform. For example, as illustrated in the left hand portion of part (d) of FIG. 2, it may be desirable to coat the pin wire in a non-uniform way so as to achieve a particular pin resiliency, deflection characteristic, or perhaps even to conserve material. At one extreme, a possible configuration might be in the form illustrated at 26 wherein a spiral coating is utilized. Similarly, as an alternative and as illustrated on the right side of part (d) of FIG. 2, it may be desirable for some appropriate reason to asymmetrically coat opposite sides of the wire 12 as indicated by the numeral 28 (perhaps better shown in part (b) of FIG. 3).

Figure 3:
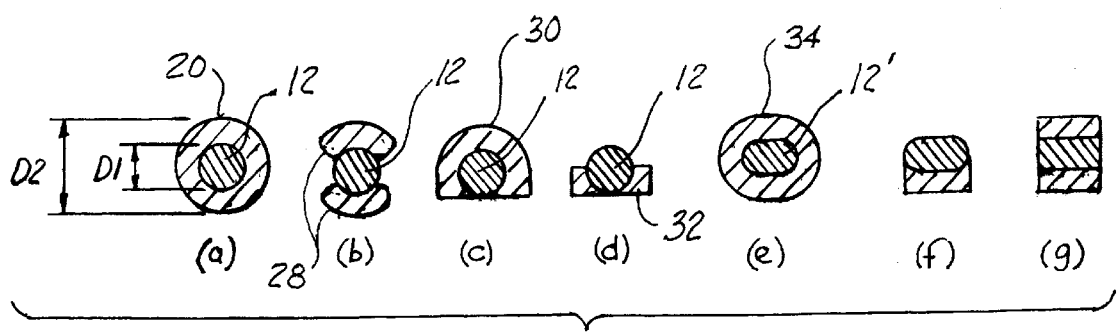
FIG. 3 is a multipart depiction of various cross-sections (a) through (g) taken along the lines 3(a)–3(g) of FIG. 2.

As other alternatives, it may be desirable to provide a laterally unbalanced coating of the wire 12 as suggested at 30 and 32 in part (e) of FIG. 2, cross-sections of these alternatives being illustrated at (c) and (d) in FIG. 3 respectively taken along the lines 3c—3c and 3d—3d of FIG. 2. And as still another alternative embodiment, it may desirable to flatten the wire 12 along its length and to provide a balanced, or uniform, coating thereover as suggested by the cross-section (e) taken along the line 3e—3e of FIG. 2. In the cross-section (e) of FIG. 3, the flattened wire is illustrated by 12'. Other flattened wire configurations with unbalanced coating and balanced coating are respectively illustrated at 36 and 38 of part (f) of FIG. 2. These alternatives are more clearly evidenced by the cross-sections (f) and (g) of FIG. 3 taken along the lines 3f—3f and 3g—3g of FIG. 2.

Figure 4:
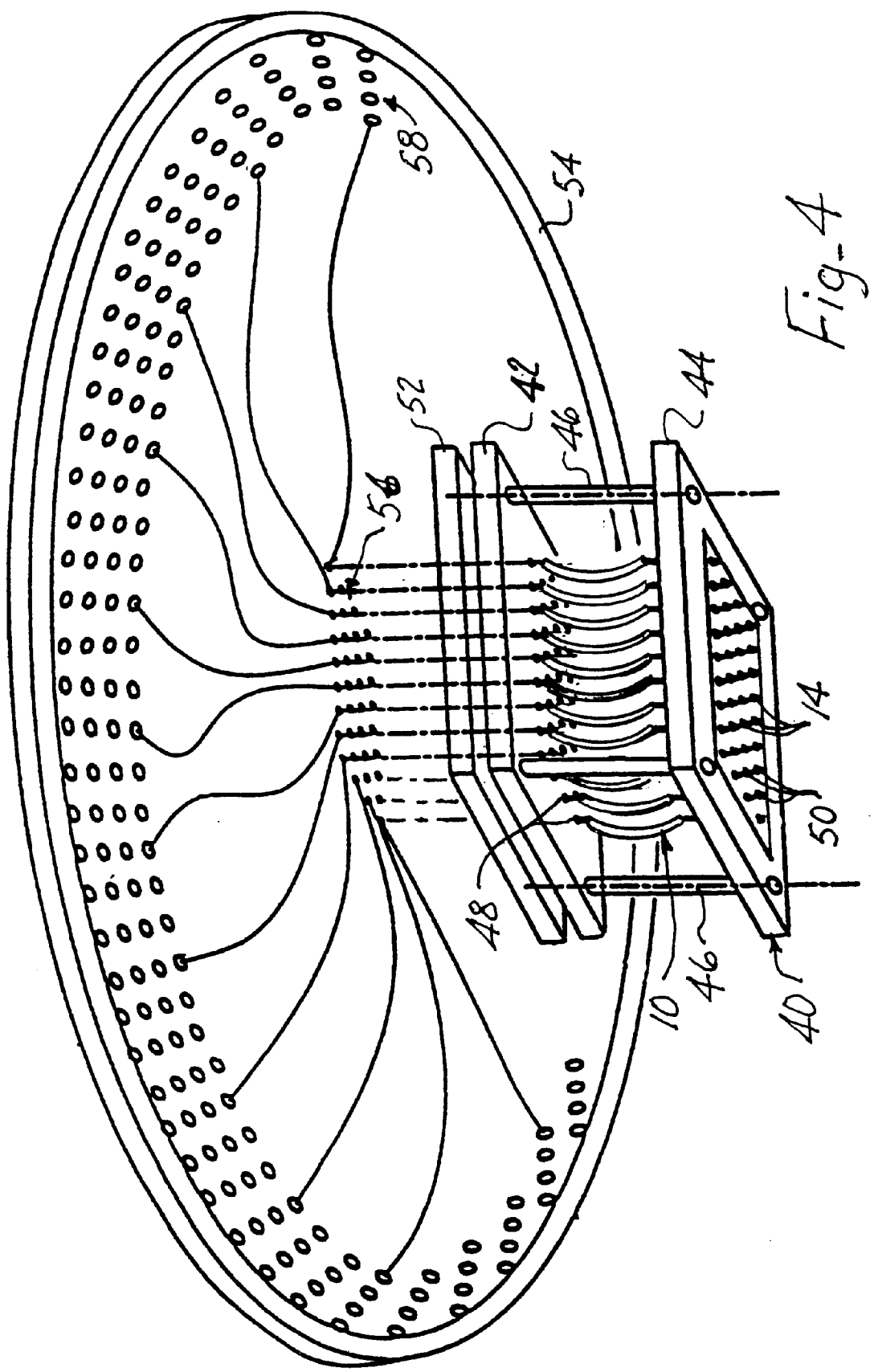
FIG. 4 is perspective view showing a wafer probe assembly including probe pins in accordance with the present invention mounted in a rectangular array.

Turning now to FIG. 4 of the drawings, use of coated pins provided in accordance with the present invention in a probe card assembly is illustrated generally at 40. The card assembly includes upper and lower alignment plates 42 and 44 maintained in fixed spaced apart disposition by four standoff pins 46 and associated fasteners (not shown). Both of the plates 42 and 44 are configured with rectangular arrays of through-holes shown generally at 48 and 50, respectively, and adapted to receive the ends of probe pins 10, in this case shown in bowed configuration as previously described with respect to part (c) of FIG. 2.

As is described in detail in my previously mentioned U.S. Pat. No. 5,952,843, the probe tips 14 extend through the holes 50 to engage a wafer to be tested, and the connector ends of the probe pins 10 extend through the through-holes 48 in upper plate 42. The probe card assembly is affixed to a mounting plate 52, also having through-holes (not shown) aligned with the holes 48 in plate 42, and facilitates attachment of the probe card assembly to an electronic test equipment interface card 54. When assembled, the connector end of each pin 10 will be electrically connected to a corresponding contact terminal of a contact array 56 with each contact being coupled to remote contact pads 58 disposed in a polar array around the card 54.

Although the present invention is primarily directed to "vertical probe" pins of the straight or bowed (curved) configurations illustrated in FIG. 2, it is anticipated that the invention will likewise be applicable to spring pin designs of the type disclosed in my prior U.S. Pat. No. , 5,952,843 as well as to cantilever type probe pins. This is to say that the present invention relates to the application of an elastic coating of the type described above to any probe pin configuration for the purpose of enhancing the resilience characteristics of the conductive pin.

In FIG. 5 a stress-strain diagram is shown illustrating functional characteristics of various probe pin configurations. The solid line 60 illustrates the force profile of a typical uncoated, cantilever style probe pin. Dashed line 62 illustrates the force profile of the same conductor configuration coating in accordance with the present invention to improve its resilience characteristic.

Curves 64 and 66 illustrate force profiles for two different uncoated "vertical probe" pin design, and dashed lines 68 and 70 respectively illustrate the pin characteristics after coating in accordance with the present invention.

In operation, as the probe card assembly is lowered, the probe tips 14 engage die pads on a wafer disposed therebeneath, and described in detail in my above mentioned prior patent effect electrical contact with the die pads on the wafer to allow testing by test equipment connected to the terminals 58. It will be appreciated from the above description that in accordance with the present invention, improved probe pins have been provided wherein the normal resiliency of the pins formed by lengths of conductive wire are enhanced by a coating of a particular non-conductive, or substantially non-conductive, but elastic material. The combination provides an enhanced probe pin configuration having features superior to prior art non-coated pins.

What is claimed is:

1. An improved probe pin for use in a wafer probe system, comprising:
   a length of resilient electrically conductive material having a connector end portion, a tip end portion, and a center portion disposed between said connector end portion and said tip end portion; and
   an elastic coating formed on said length of conductive material along at least a substantial part of said center portion, said coating having relatively low electrically conductivity and relatively high elasticity, said elastic coating serving to substantially enhance the resilient characteristics of said length of conductive material.

2. An improved probe pin as recited in claim 1 wherein said length of conductive material is selected from the group consisting of gold, platinum, nickel, tungsten, copper and alloys thereof, electrically conductive plastics, stainless steel, electrically conductive polymer composites, berilium copper, rhenium tungsten and neodymium.

3. An improved probe pin as recited in claim 2 wherein said elastic coating is Nitinium.

4. An improved probe pin as recited in claim 1 wherein said center portion is substantially straight and said tip end portion is canted relative to the longitudinal axis of said enter portion at an angle of θ degrees wherein θ is within the range of 0°–12°.

5. An improved probe pin as recited in claim 1 wherein said center portion is curved.

6. An improved probe pin as recited in claim 1 wherein said elastic coating is uniformly distributed along the length of said center portion.

7. An improved probe pin as recited in claim 1 wherein said elastic coating is asymmetrical about the axis of said center portion.

8. An improved probe pin as recited in claim 1 wherein said elastic coating is asymmetrical about at least one orthogonal axis in a plane transverse to the length of said center portion.

9. An improved probe pin as recited in any of claims 1, 4–8 wherein said elastic coating is Nitinium.

10. An improved probe pin as recited in any of claims 1, 4–8 wherein said elastic coating is selected from the group of materials consisting of metals, alloys, ceramics, polymer composites and hybrid materials known to those skilled in the art to have properties substantially equivalent to the properties of Nitinium.

11. In a wafer probing apparatus including a probe assembly having a plurality of probe pins relatively aligned in a predetermined configuration and electrically connected to an interface card, an improved probe pin comprising:
   a length of resilient electrically conductive material having a connector end portion, a tip end portion and a center portion disposed between said connector end portion and said tip end portion; and
   an elastic coating formed on said length of conductive material along at least a substantial part of said center portion, said elastic coating having relatively low electrical conductivity and relatively high elasticity, said elastic coating serving to substantially enhance the resilient characteristics of said length of conductive material.

12. In a wafer probing apparatus, an improved probe pin as recited in claim 11 wherein said length of conductive material is selected from the group consisting of gold, platinum, nickel, tungsten, copper and alloys thereof, electrically conductive plastics, stainless steel, electrically conductive polymer composites, berilium copper, rhenium tungsten and neodymium.

13. In a wafer probing apparatus, an improved probe pin as recited in claim 11 wherein said elastic coating is Nitinium.

14. In a wafer probing apparatus, an improved probe pin as recited in claim 11 wherein said center portion is substantially straight and said tip end portion is canted relative to the longitudinal axis of said center portion at an angle of θ degrees wherein θ is within the range of 0°–12°.

15. In a wafer probing apparatus, an improved probe pin as recited in claim 11 wherein said center portion is curved.

16. In a wafer probing apparatus, an improved probe pin as recited in claim 13 wherein said elastic coating is uniformly distributed along the length of said center portion.

17. In a wafer probing apparatus, an improved probe pin as recited in claim 13 wherein said elastic coating is asymmetrical about the axis of said center portion.

18. In a wafer probing apparatus, an improved probe pin as recited in claim 13 wherein said elastic coating is asymmetric about at least one orthogonal axis in a plane transverse to the length of said center portion.

19. In a wafer probing apparatus, an improved probe pin as recited in any of claims 11, 12, 14 and 15 wherein said elastic coating is Nitinium.

20. In a wafer probing apparatus, an improved probe pin as recited in any of claims 10, 12, 14 and 15 wherein said elastic coating is selected from the group of materials consisting of metals, alloys, ceramics, polymer composites and hybrid materials known to those skilled in the art to have properties substantially equivalent to the properties of Nitinium.

* * * * *